United States Patent [19]
Noguchi et al.

[11] 3,947,760
[45] Mar. 30, 1976

[54] INTEGRATING COMPONENT MEASURING DEVICE

[75] Inventors: Hitoshi Noguchi, Hachioji; Kohichi Maeda, Tachikawa; Takeshi Kyo, Hachioji, all of Japan

[73] Assignee: Hewlett-Packard Company, Palo Alto, Calif.

[22] Filed: Jan. 3, 1975

[21] Appl. No.: 538,496

Related U.S. Application Data
[63] Continuation of Ser. No. 415,855, Nov. 14, 1973, abandoned.

[52] U.S. Cl. ............ 324/57 R; 324/59; 324/60 CD
[51] Int. Cl.² ...................................... G01R 27/00
[58] Field of Search ............... 324/57 R, 60 CD, 59

[56] References Cited
UNITED STATES PATENTS

| | | | |
|---|---|---|---|
| 3,018,438 | 1/1962 | Mustert | 324/57 R |
| 3,319,162 | 5/1967 | Sattinger et al. | 324/57 R |
| 3,771,050 | 11/1973 | Golahny et al. | 324/57 R |

*Primary Examiner*—Stanley T. Krawczewicz
*Attorney, Agent, or Firm*—A. C. Smith; Allston L. Jones

[57] ABSTRACT

A method and means for measuring the electric properties of capacitor, inductor and resistor elements is described. The element to be measured and a reference element are connected in series, and standard A.C. voltage is applied to one end of the series circuit whereas a variable voltage is applied to the other end of said circuit. The variable voltage is controlled in order to zero the voltage or the current at the common junction of both the element to be measured and the reference element. Said standard voltage and said variable voltage are rectified, and the generated D.C. signals are used for charging integrator capacitors. These capacitors are then discharged and the ratio of charging and discharging time is a measure of the resistance, capacitance and inductance, respectively, of the unknown element. Dielectric and magnetic dissipation factors may be measured in a similar manner.

6 Claims, 5 Drawing Figures

3,947,760

INTEGRATING COMPONENT MEASURING DEVICE

This is a continuation of application Ser. No. 415,855, filed Nov. 14, 1973 now abandoned.

BACKGROUND OF THE INVENTION

As elements, resistors, inductors and capacitors are generally used. Though each of these elements is manufactured individually, it is difficult to manufacture pure elements. Capacitors, for example, have some leakage resistance, and resistors include some capacitance and inductance. In most cases, each of the three kinds of elements includes impurities of the two other units.

A.C. bridge method is usually applied to make precise measurement of value of the element including impure components. However, in order to balance the bridge circuit, for instance, the voltage across the standard component or the standard itself must be adjusted. Additionally, to minimize or compensate phase difference caused by the variable voltage source or the variable standard, expensive circuit parts or complicated circuit composition are needed. As a result, the conventional instrument is expensive and lacks reliability in spite of taking more time for adjustment.

Summary of the Invention

The primary object of the present invention is to provide an improved instrument for measuring resistance, capacitance and inductance of elements.

The present invention eliminates above described disadvantages and provides a component measuring device having very simple circuit composition without losing the advantage of the null method in A.C. bridge method.

Another object of the present invention is to provide a component measuring device in which an integrator is charged by a voltage proportional to the resistance component or a voltage proportional to the reactance component and discharged by a reference voltage, the charging and discharging times being compared and the values of the components being displayed in digits.

In one embodiment of the present invention, the element to be measured (such as resistor, capacitor and inductor) and the reference element are connected in series, and a reference signal is provided at one end of the serial circuit while a variable signal is automatically adjusted to null at least one of the junction voltage and the current junction at the common junction of the element to be measured and the reference element. When the null voltage is balanced, the variable signal is divided into the in-phase component and the 90° shifted component (both in view of the reference signal). The integrator capacitor is charged from initial level for a certain time with the D.C. signal corresponding to the value of the in-phase component or the 90° shifted component, and then the charged integrator capacitor is discharged till the initial level with a certain D.C. signal corresponding to the reference signal. The ratio of the discharging time to the charging time is counted by the electric counter and the value of the component to be measured is displayed in digits.

DESCRIPTION OF A PREFERRED EMBODIMENT

Figures 1A, 1B:
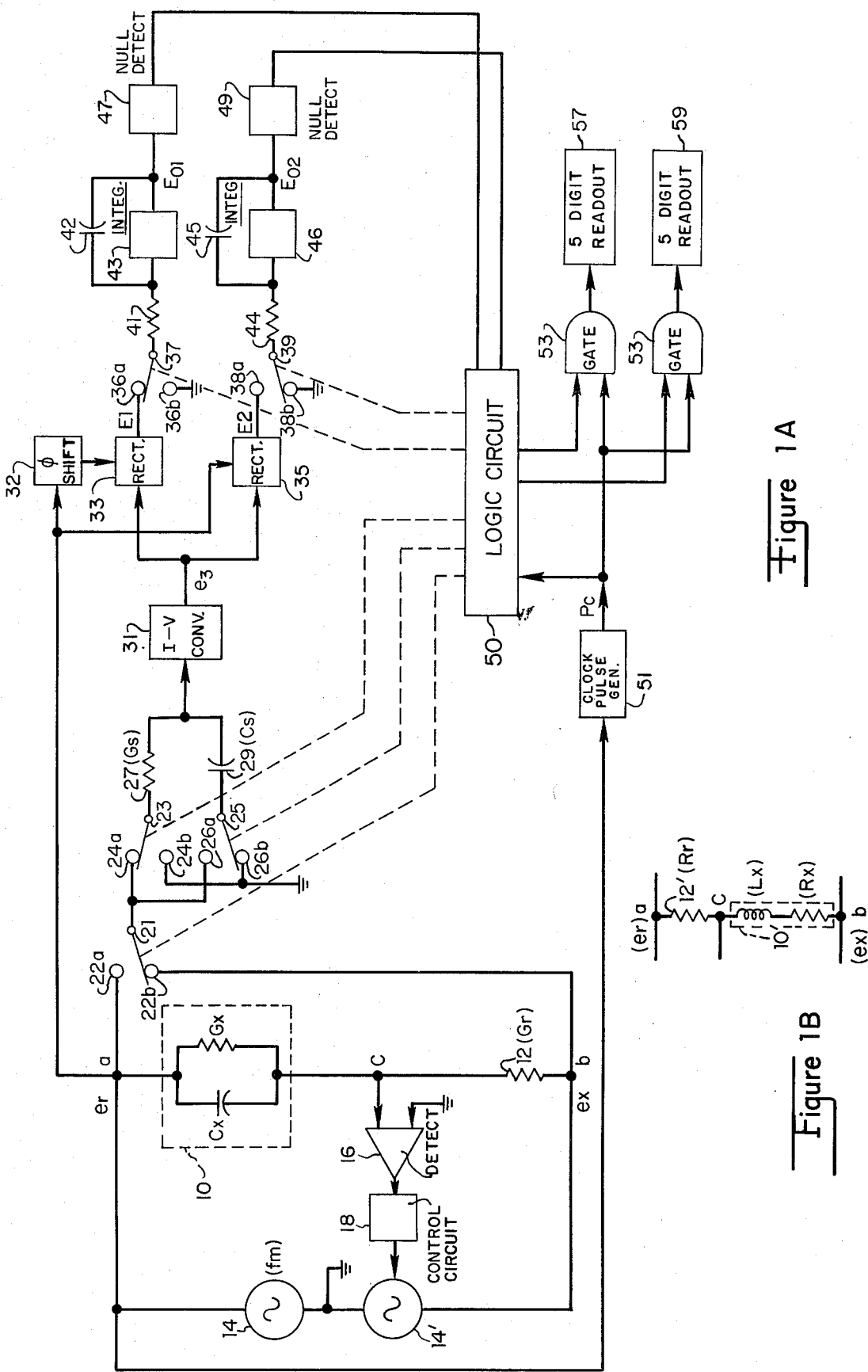
FIG. 1A is the block diagram of a preferred embodiment of the present invention.
FIG. 1B shows a modification in the arrangement of the element to be measured and of the reference element, this modification being suitable for measuring inductances.

Referring to FIG. 1A, 10 is the element to be measured and 12, the reference component. The capacitor to be measured, 10, implies capacitance Cx and parallel equivalent conductance Gx, 12 is the reference conductance Gr. Numerals 14 and 14' indicate A.C. signal sources of common frequency. 16 indicates a voltage detective circuit, and 18 is a voltage control circuit. A.C. voltages $e_r$ and $e_x$, in opposite phase of each other, are provided to both terminals "a" and "b" from the A.C. signal source 14 and 14' respectively. The voltage at the connection "c" of both components 10 and 12 is compared with the reference potential (or the ground potential) at the voltage detective circuit 16, and the control signal matching with the value of the difference voltage is transmitted to the A.C. signal source 14' over the voltage control circuit 18. If the voltage gain in said detective circuit is sufficiently larger than 1, the value of said voltage $e_x$ is automatically controlled so that the voltage at the said common junction "C" becomes zero.

The reference signal voltage $e_r$ and the variable signal voltage $e_x$ are supplied to the standard resistor 27 or the standard capacitor 29 through switches 21 and 23 and 25, and lead into the input of the synchronous rectifier circuit 33 and 35 through the current-voltage converter 31. The said reference signal $e_r$ is fed to the input of the first rectifier circuit 33 through 90° phase shifting circuit 32, and the reference signal $e_r$ is fed to the input of the second rectifier circuit 35. 43 is the first integrator circuit including integrator capacitor 42, and 46 is the second integrator circuit including integrator capacitor 45, respectively, and 47 and 49 are null level detectors. The output voltage E1 of the said first rectifier circuit 33 is lead into the first integrator 43 through the switch 37, and the output of the said integrator 43 is connected to the null detector 47. The output voltage E2 of the second rectifier circuit 35 is, in the same manner, lead into the second integrator 46, and the output is connected to the null detector 49. 50 indicates a logic circuit to control said switches and a gate circuit of a counter according to the output signals of the said null detectors 47 and 49. The output pulse Pc of a clock pulse generator circuit 51 is fed to the said logic circuit 50 to synchronize the control operation with the period of the A.C. signal $e_r$. 53 and 55 indicate gate circuits and 57 and 59 indicate digital displays. The measuring procedure according to the present embodiment of the invention is as follows:

I. Measurement of the Capacitance Cx (Refer to the timing diagram in FIG. 2A)

First, if the voltage at the common junction "C" of the element to be measured, 10 and the reference element 12 is balanced to zero by the closed loop circuit including reference element 12, voltage detective circuit 16 and voltage control circuit 18. The current flowing to the element 10 by virtue of the reference signal voltage $e_r$ is proportional to the admittance of the said component 10, and then the value of the variable signal voltage $e_x$ is proportional to the said admittance. The relation between the reference signal voltage $e_r$ and the variable signal voltage $e_x$ when balanced, can be expressed as follows:

$$e_x = -\left(\frac{Gx}{Gr} + \frac{J\omega Cx}{Gr}\right)e_r \qquad (1)$$

Second, the contacts of switches at the time $t_0$ are assumed as follows: 21–22b, 23–24a, 25–26b, 37–36a, and 39–38b. Then the output voltage of the current-voltage converter 31, $e_3$, can be expressed as follows:

$$e_3 = -KGs\, e_x$$
$$= -K\left(\frac{Gx}{Gr} + \frac{j\omega Cx}{Gr}\right)Gs\, e_r \qquad (2)$$

Here, K is a constant and Gs, the conductance of the standard resistor 27. Then the said signal voltage $e_3$ is converted into the D.C. voltage E1, proportional to the capacitance Cx by means of the first synchronous rectifier circuit 33. If the A.C.-D.C. converting ratio at this time is $\eta 1$ ($\eta 1$=mean value of E1/r.m.s. of $e_3$), the said D.C. voltage E1 can be expressed as follows:

$$E1 = -K\,\frac{\omega Cx}{Gr}Gs\,\eta\,1\,e_r \qquad (3)$$

The D.C. voltage E1 is charged to the capacitor 42 through the serial resistor 41. Assume the initial charge of the capacitor 42 at the time $t_0$ is zero. Taking note of the integrator charging time (T1), the input voltage $e_3$ of the rectifier circuit in this case is a sinusoidal voltage, and the output voltage is the pulsating voltage of the fullwave rectification and not complete D.C. Therefore, unless the input voltage to the integrator 43 is integrated for the complete one period of the pulsating voltage, an error will arise. Thus, the charging time T1 should be selected using the period $\tau m'$ ($1/fm$) of the A.C. signal as follows:

$$T_1 = n_1 \tau m \qquad (4)$$

Figure 2A:
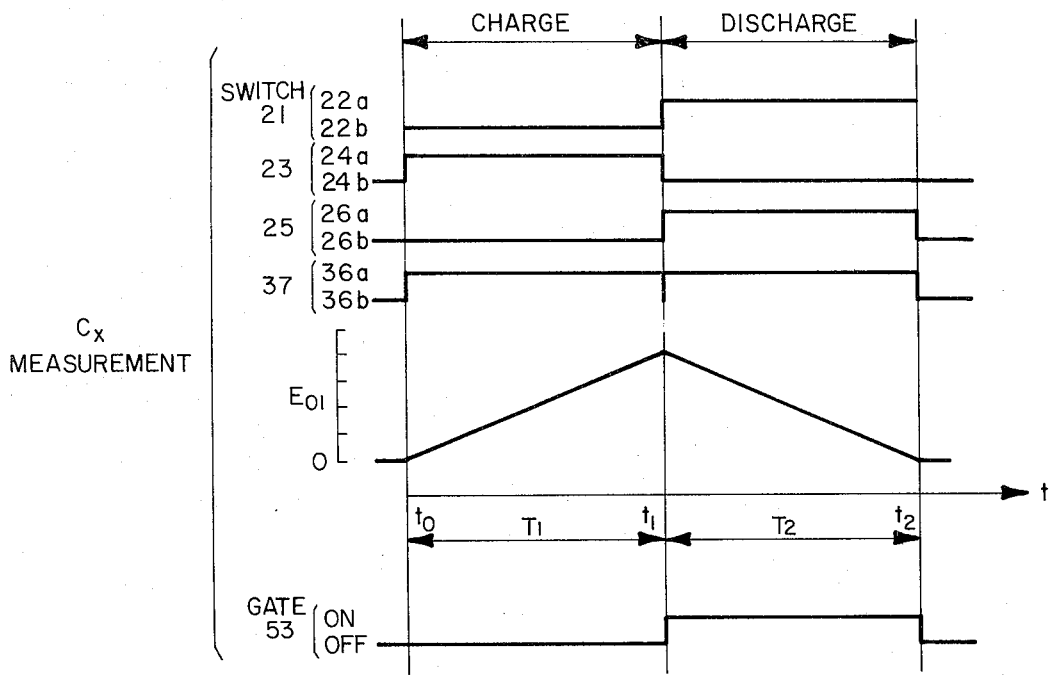
FIG. 2A is a time diagram illusrating measuring of the capacitance of a given element.

$n_1$ here is a certain value selected, for example, 10,000 according to the full scale value of display 57 (59). This will be easily achieved by means of the clock pulse $P_c$ synchronized with the reference signal $e_r$ and by means of the logic circuit 50 using this synchronized clock pulse to control the switches. Thus, as illustrated in FIG. 2A, the output voltage $E_{01}$ of the integrator 43 continues to increases from the time $t_0$ to the time $t_1$, the slope thereby being proportional to the capacitance Cx.

Next, at the time $t_1$, switches connect 21 to 22a, 23 to 24b, 25 to 26a using the control signal from logic circuit 50 (except for 37 and 39). The input signal voltage $e'3$ of the first rectifier circuit 33 at the time is expressed as follows:

$$e'3 = K\omega Cs\, e_r \qquad (5)$$

So, the output voltage E1 is $$E'1 = K\omega Cs\,\eta_1\, e_r \qquad (6)$$

The D.C. voltage E'1 is in the opposite polarity to the D.C. voltage E1 and is constant. This means the charge of integrator capacitor 42 at the time $t_1$ is discharged with a constant slope by said voltage E1. Then the output voltage $E_{01}$ of the integrator 43 is detected to be zero by the null detector 47 (the time is then $t_2$), and the logic circuit 50 is controlled by the null detector signal. Thus the first operation is completed.

In the integrator capacitor 42, the charged quantity of electricity in the time T1 and the discharged quantity of electricity in the time T2 (from $t_1$ to $t_2$) is the same, so capacitance Cx is directly read by counting the number of clock pulses Pc corresponding to discharging time T2. That is, gate circuit 53 is opened for the time T2 by the control signal from logic circuit 50, and the clock pulse Pc passing during the time is counted by the display 57 to indicate the result ($n_2$).

The charging and the discharging quantity of the electricity $q_1$ is as follows:

$$q_1 = Kk_1\,\omega Cx/Gr\,Gs\,\eta_1\,e_r n_1 r\; m = Kk_1\omega Cs\,\eta_1\,e r n_2 \tau m \qquad (7)$$

K1, here is the constant value of integrator 43. Thus, the following equation (8) can be derived from the above equation (7).

$$Cx = \frac{Gr}{Gs} Cs\, \frac{n_2}{n_1} \qquad (8)$$

The unknown capacitance $C_x$ can directly be read on the display 57 by counting $n_2$.

It is well understood from the above equations (7) and (8) that the characteristic values $K$, $\eta$, and $k1$ of the current-voltage converting circuit 31, phase discriminator circuit 33 and integrator 43, respectively, have the same effect upon charging cycle and discharging cycle of the capacitance 42, and that they cancel each other. Thus, measuring error will not occur unless the constant values change during a single measuring cycle (T1 + T2). Thus, the present invention makes best use of the advantage of the null method without having the disadvantages of using a galvanometer, the characteristic of which may cause measuring errors.

Figure 2B:
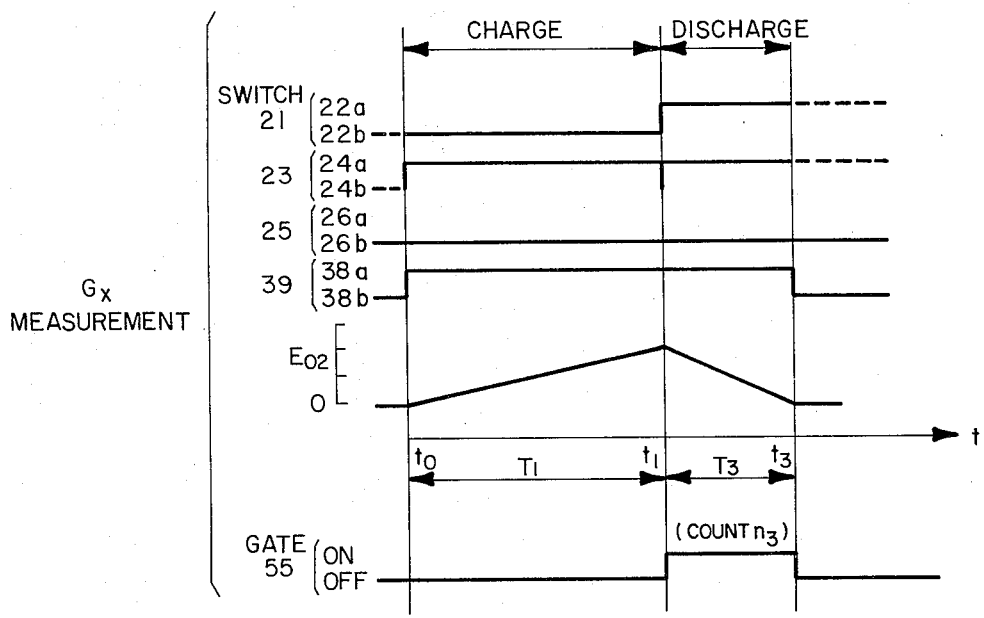
FIG. 2B is a time diagram illustrating measuring of the parallel conductance of the same element.

II. Measuring of the Parallel Equivalent Conductance Gx (Refer to FIG. 2B)

First, at the time $t_0$, the relations between switches and junctions are as follows: 21–22b, 23–24a, 25–26b, 37–36b, and 39–38a. At this time, input signal voltage $e_3$ of the second synchronous rectifier circuit 35 is obtained by equation (2), and the output D.C. voltage E2 is obtained as follows:

$$E2 = -K\,\frac{Gx}{Gr}Gs\,\eta_2\, e_r \qquad (9)$$

wherein $\eta_2$ is the conversion efficiency of the second rectifier circuit 35. The above D.C. voltage E2 is charged to the integrator capacitor 45 for a certain period T1 through the serial resistor 44.

Next, at the time $t_1$, after the period T1, switch 21 is changed over to the junction 22a. The output rectification voltage E2' is then as follows:

$$E2' = KGs\,\eta_2\, e_r \qquad (10)$$

After the time $t_1$, the integrator capacitor 45 is discharged by the said D.C. voltage E2', and output voltage $E_{02}$ of the integrator 46 is detected to be zero level (the time is then $t_3$) by the null detector 49, and with this null detect signal logic circuit 50 is controlled. As a result, the second gate circuit 55 is opened for the time T3 (from $t_1$ to $t_3$), and the number ($n_3$) of the clock pulses Pc having passed the gate circuit 55 during the time T3 is displayed by the display 59.

The charging and discharging quantity of the electricity $q_2$ in the integrator capacitor 45 is as follows:

$$q_2 = Kk_2\ Gx/Gr\ Gs\ \eta_2\ ern_1\ \tau m = Kk_2\ Gs\eta_2 ern_3 \tau m \dots \quad (11)$$

$k_2$ is the constant value of the second integrator 46. $Gx$ is obtained from the above equation (11)

$$Gx = G_r n_3/n_1 \dots \quad (12)$$

As the above equation (12) shows, the unknown conductance $Gx$ can be directly read on display 59 afterr counting $n_3$.

Figure 2C:
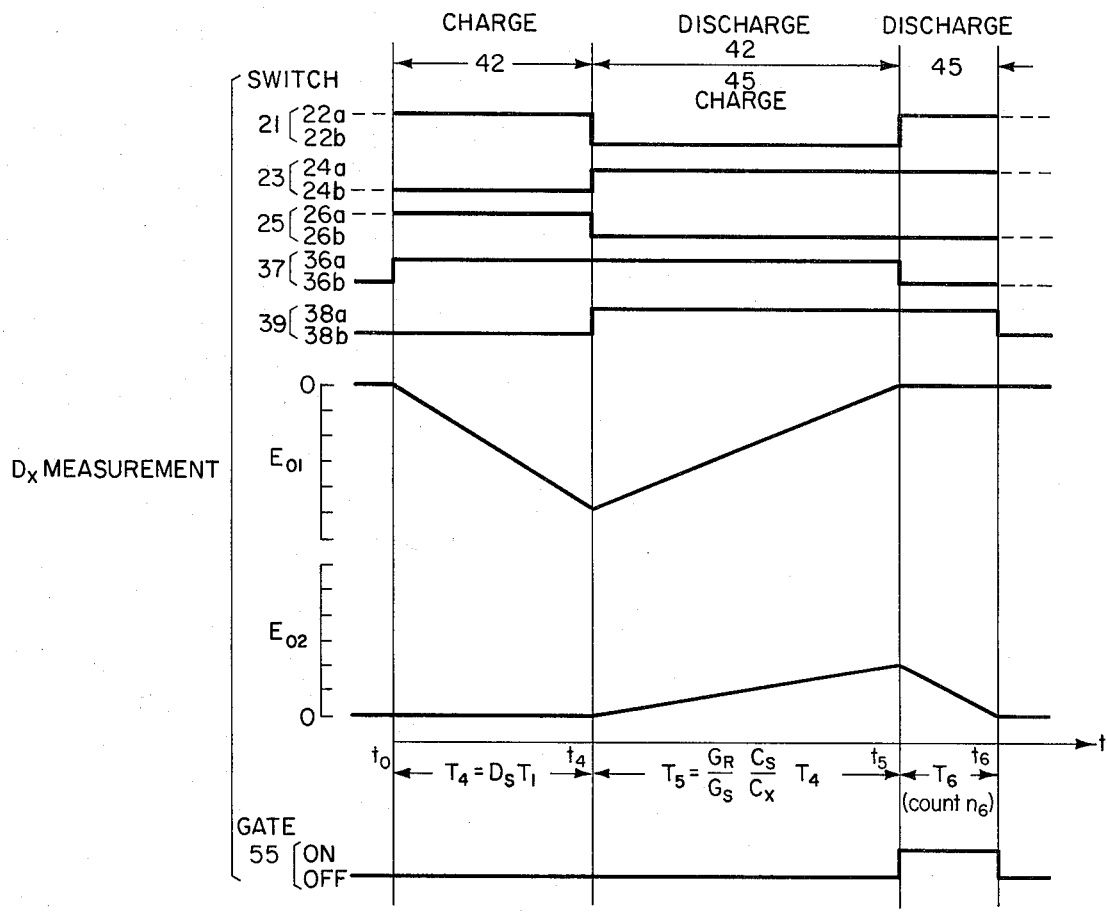
FIG. 2C is a time diagram illustrating measuring of the dielectric dissipation factor of the same element.

III. Measuring of the Dielectric Dissipation Factor (Refer to FIG. 2C)

First, the relation between the switches and the junctions at the time $t_0$ is 21–22a, 23–24b, 25–26a, 37–36a, and 39–38b. At this time, the output D.C. voltage E1 of the first rectifier circuit 33 is the same as the said equation (6). That is:

$$E1 = K\omega Cs\ \eta_1\ e_r \dots \quad (6')$$

The time T4 to charge the above rectified voltage E1 to the integrator capacitor 42 is selected by multiplying said time T1 by the reference dielectric dissipation factor as follows:

$$T4 = n_4\ \tau m = Dsn_1\ \tau m \quad (13)$$

The dielectric dissipation factor Ds is temporarily defined with the conductance Gs of the resistance 27 and the capacitance Cs of the standard capacitor 29 as follows:

$$Ds = Gs/\omega Cs \dots \quad (13')$$

If the frequency of the AC signal $fm = 1$MHz, $Cs = 100$pF, $Gs = 1mv$, then $Ds = 1.592$, and the time T4 of the above equation (13) is the constant value of 1.592 T1.

Next, at the time $t_4$ when the above time T4 has ended, switches change as follows: 21–22b, 23–24a, 25–26b, and 39–38a (except for 37–36a). At this time, the D.C. voltages E1' and E2 obtained in the output of the rectifier circuits 33 and 35 are expressed as follows:

$$E1' = -K\ \frac{\omega Cx}{Gr}\ Gs\ \eta_1\ e_r \quad (3')$$

$$E2 = -K\ \frac{Gx}{Gr}\ Gs\ \eta_2\ e_r \quad (14)$$

In the first integrator 43, the quantity of the electricity charged to the capacitor 42 during the time T4 by virtue of the D.C. voltage E1 is discharged by virtue of the rectified voltage E1' after the time $t_4$. If the integrator output $E_{01}$ is zero potential at the time $t_5$ after the time T5, (the number of pulses during the time T5 is $n_5$) the quantity of the electricity $q_3$ in the charging and discharging cycle is as follows:

$$q_3 = Kk_1 \omega Cs\eta_1 ern_4 \tau m = Kk\ \omega Cx/1Gr\ Gs\eta_1 ern_5 \tau m \dots \quad (15)$$

and from the above equation the following equation is obtained:

$$n_5 = \frac{Gr}{Gs}\ \frac{Cs}{Cx}\ n_4 \quad (16)$$

Next, in the second integrator 46 during said time T5, the capacitor 45 is charged by D.C. voltage E2 shown in the said equation (14), and the quantity of the electricity $q_4$ is expressed as follows:

$$q_4 = Kk_2\ \frac{Gx}{Gr}\ Gs\ \eta_2\ ern_5\ \tau m \quad (17)$$

and associated with the equation (16), the above equation (17) can be converted as follows:

$$q_4 = Kk_2 Gx\ \frac{Cs}{Cx}\ \eta_2\ ern_4\ \tau m \quad (17')$$

Then, at the time $T_5$, the positions of switches are 21–22a, 37–36b(23–24a, 25–26b, 39–38a are left unchanged). The integrator capacitance 45 is discharged by the D.C. voltage E2' shown by the equation (10) and if the quantity of the electricity is zero at the time $t_6$, the discharging quantity $q_4$ (corresponding to said charging quantity) can be expressed as follows:

$$q_4 = Kk_2 Gs\eta_2\ ern_6\ \tau m \dots \quad (18)$$

From the above equation (17') and (18), following equation is obtained:

$$\frac{n_6}{n_1} = \frac{Gx}{\omega Cx} = Dx \quad (19)$$

As above equation (19) shows, the second gate circuit 55 is opened during the time T6 (from $t_5$ to $t_6$), and the number $n_6$ of the clock pulses having passed the circuit 55 is counted and indicated by the display 59 to read directly the unknown dielectric dissipation factor.

Above description relates to measuring of the capacitance $Cx$ of a capacitor, parallel equivalent conductance $Gx$, and the dielectric dissipation factor $Dx$, and in the case of measuring either $Cx$ or $Gx$, a single integrator circuit is sufficient. As a reference component 12, in this case, a resistor is used but a capacitor might be used too.

In the case of measuring the inductance $Lx$ of an inductor element, its series equivalent resistance $Rx$ and the magnetic ddissipation factor $DL$ ($=Rx/\omega Lx$) of the unknown element 10', (FIG. 1B), the reference signal $e_r$ is fed to a reference resistance 12' (its value is $Rr$) as shown in FIG. 1B, and the constant current ($e_r/Rr$) flows to the element 10'. Thus, the voltage drop $e_x$ across said element 10' can be taken as a value proportional to ($Rx + j\omega Lx$). As the measurement is almost the same as the above described capacitor, measurement further description can be omitted.

In the described embodiment of the present invention with for example, $fm = 1$MHz and $n_1 = 10,000$ a LCR meter having a counting speed of 10ms and a resolution is 10⁻⁴ may be employed as counting device.

We claim:

1. A method for measuring the electric properties of capacitance, inductance and resistance of an element to be measured, said method comprising the steps of:
   connecting the element to be measured and a reference element in a serial circuit;
   serially connecting a standard A.C. signal source and a variable A.C. signal source to the serial circuit;
   controlling said variable signal source to null at least one of a junction voltage and a junction current produced at the common junction of the element to be measured and the reference element;
   alternately coupling the A.C. signals to a standard circuit to generate a signal proportional to the element values of the standard circuit;
   synchronously rectifying the signal proportional to the element values of the standard circuit;
   charging and discharging an integrating capacitor in proportion to said rectified signals; and
   measuring an electrical property component of said element to be measured by counting the ratio of the charging and the discharging times of the integrating capacitor.

2. The method according to claim 1, wherein the reactive electrical component and the resistive electrical component of the element to be measured are measured in two separate paths, each path performing the steps of:
   synchronously rectifying the signal proportional to the element values of the standard circuit;
   charging and discharging an integrating capacitor in proportion to said rectified signals; and
   measuring an electrical property component of said element to be measured by counting the ratio of the charging and the discharging times of the integrating capacitor.

3. The method according to claim 2, wherein rectifying of the signals proportional to the element values of the standard circuit is controlled by the standard A.C. signal in said resistance path and by a 90° phase shifted standard A.C. signal in said reactance path.

4. An apparatus for measuring the electric properties of capacitance, inductance and resistance of an element to be measured comprising:
   a reference element;
   means for connecting the element to be measured and the reference element in a serial circuit;
   a source of standard A.C. signal;
   a variable source of A.C. signal having a value that is controlled in response to a signal applied thereto;
   means for serially connecting the signal sources to the serial circuit;
   means coupling the signal appearing at the common junction of the element to be measured and the reference element to said variable A.C. signal to null at least one of a junction voltage and a junction current produced at the common junction of the element to be measured and the reference element;
   standard circuit means;
   means for selectively impressing said standard A.C. signal and said variable A.C. signal on standard circuit means to provide a voltage signal proportional to said standard circuit means element values;
   means for synchronously rectifying said standard A.C. signal and said variable A.C. signal after passing through said standard circuit means;
   an integrating capacitor;
   means for charging and discharging an integrating capacitor in proportion to said rectified signals; and
   means for measuring an electrical property component of said element to be measured by counting the ratio of the charging and the discharging times of said integrating capacitor.

5. The apparatus according to claim 4, comprising two separate paths for measuring the reactive electrical component and the resistive electrical component of the element to be measured, each of said paths including:
   means for synchronously rectifying said standard A.C. signal and said variable A.C. signal after passing through said standard circuit means;
   means for charging and discharging an integrating capacitor in proportion to said rectified signals; and
   means for measuring an electrical property component of said element to be measured by counting the ratio of the charging and the discharging times of said integrating capacitor.

6. The apparatus according to claim 5 further comprising means for controlling said rectifying means by the standard A.C. signal in said resistance path and by a 90° phase shifted standard A.C. signal in said reactance path.

* * * * *

UNITED STATES PATENT AND TRADEMARK OFFICE
CERTIFICATE OF CORRECTION

PATENT NO. : 3,947,760
DATED : March 30, 1976
INVENTOR(S) : Hitoshi Noguchi, Kohichi Maeda, and Takeshi Kyo It is certified that error appears in the above-identified patent and that said Letters Patent are hereby corrected as shown below:

Column 1, line 49, "current junction" should read -- junction current --;

Column 2, line 34, "and 25" should read -- or 25 --; line 66, "18. The" should read -- 18, the --;

Column 4, between lines 20 and 24, that portion of equation (7) reading $$e_r n_1 r \ m = K k_1 \omega Cs$$

should read $$e_r \ n_1 \ \tau m = K k_1 \omega Cs \ --;$$

Column 5, line 20, "afterr" should read -- after --;

Column 6, line 38, after "(18)," insert -- the --; line 58, "ddissipation" should read -- dissipation --; lines 65-66, "measurement further description" should read -- further description of the measurement --.

Signed and Sealed this

Twenty-first Day of September 1976

[SEAL]

Attest:

RUTH C. MASON
Attesting Officer

C. MARSHALL DANN
Commissioner of Patents and Trademarks